United States Patent
Varadarajan et al.

(10) Patent No.: US 9,698,779 B2
(45) Date of Patent: Jul. 4, 2017

(54) RECONFIGURING AN ASIC AT RUNTIME

(71) Applicant: Texas Instruments Incorporated, Dallas, TX (US)

(72) Inventors: Devanathan Varadarajan, Dallas, TX (US); Karthik Srinivasan, Bangalore (IN); Neel Talakshi Gala, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 364 days.

(21) Appl. No.: 14/506,216

(22) Filed: Oct. 3, 2014

(65) Prior Publication Data
US 2015/0100608 A1     Apr. 9, 2015

(51) Int. Cl.
*G06F 7/57* (2006.01)
*H03K 19/00* (2006.01)
*H03K 19/177* (2006.01)

(52) U.S. Cl.
CPC ... *H03K 19/0008* (2013.01); *H03K 19/17752* (2013.01); *H03K 19/17764* (2013.01)

(58) Field of Classification Search
None
See application file for complete search history.

(56) References Cited

U.S. PATENT DOCUMENTS

| | | | | | |
|---|---|---|---|---|---|
| 5,949,248 | A | * | 9/1999 | LaMacchia | ........ H03K 19/0033 326/21 |
| 8,161,308 | B2 | * | 4/2012 | Hisamatsu | ............ H04L 49/40 370/395.1 |
| 8,706,793 | B1 | * | 4/2014 | Young | ...................... G06F 5/01 708/620 |
| 2008/0306637 | A1 | * | 12/2008 | Borumand | ................ H02J 1/14 701/3 |
| 2015/0100608 | A1 | * | 4/2015 | Varadarajan | ..... H03K 19/17764 708/190 |
| 2015/0148995 | A1 | * | 5/2015 | Scheffler | ................... H02J 3/14 701/3 |

OTHER PUBLICATIONS

Neel Gala et al., "Progressive Configuration Aware Design Methodology for Low Power Stochastic ASICs", 2014 27th International Conference on VLSI Design and 2014 13th International Conference on Embedded Systems, pp. 342-347.

* cited by examiner

*Primary Examiner* — David H Malzahn
(74) *Attorney, Agent, or Firm* — Jacqueline J. Garner; Charles A. Brill; Frank D. Cimino

(57) ABSTRACT

Methods for reconfiguring an ASIC at runtime without using voltage over scaling. A functional criticality of a set of logic in the ASIC is identified. Then, the set of logic are classified into a set of regions based on the functional criticality, each region of the set of regions having a target error threshold. Further, each region is power gated at runtime based on the functional criticality such that the target error threshold is achieved without using voltage over scaling.

20 Claims, 2 Drawing Sheets

RECONFIGURING AN ASIC AT RUNTIME

CROSS REFERENCE TO RELATED APPLICATIONS

This application claims priority from India provisional patent application 4516/CHE/2013 filed on Oct. 4, 2013, which is hereby incorporated by reference in its entirety.

TECHNICAL FIELD

The present disclosure relates to reconfiguration of an application specific integrated circuit (ASIC) at runtime.

BACKGROUND

With increasing integration of capabilities into mobile application processors, a host of imaging operations that were earlier performed in software is now implemented in hardware. Though imaging applications are inherently error resilient, the complexity of such designs has increased over time and thus identifying logic that can be leveraged for energy quality trade-offs has become difficult.

Continued technology scaling, as promised by Moore's law, along with increasing power consumption of applications has made conserving battery life a crucial aspect for multimedia applications targeting mobile processors. The fact that this class of applications is inherently error-resilient is yielding the way to stochastic computing techniques, wherein the accuracy of the output is traded for significant power savings. An essential aspect of stochastic computing lies in accurately identifying functionally non-critical logic within an ASIC design which can be leveraged for significant energy-quality trade-offs. Current day system on chips (SoCs) employ a large variety of user enabled/disabled features in order to cater to a wider audience. Identifying functional criticality for such design and harboring various modes of configuration is not an easy task.

Several prior approaches have investigated techniques for identifying functionally significant/critical logic and power reduction for digital signal processing (DSP) systems. One prior approach identifies the impact of each flip flop on the output quality and categorizes them into various criticality bins. This framework has a simulation penalty which is linear in the number of flip flops of the design, making it unsuitable for larger ASICs, which harbor tens of thousands of flip flops. Another technique in approximate computing prunes away circuit elements which have the least probability of being active. Though this framework is demonstrated only on arithmetic circuits, a significant shortcoming of this approach lies in the huge penalty of gate-level simulations that need to be performed. The resulting design also suffers from the inability to work in exact mode of computation.

Another approach proposes a slack redistribution methodology to allow a graceful degradation in quality when subjected to voltage scaling. To avoid the penalty of gate-level simulations, this approach uses a toggle-rate based error metric which treats all errors with equal weightage. The resulting design suffers from an increased area overhead of the design due to cell-swaps used to re-distribute slack. In yet another technique, a significance driven computation strategy through cross-layer optimizations at algorithmic and hardware levels is implemented. The hardware design is manually restructured to ensure faster significant computations and slower non-significant computations. The optimizations in this technique are highly specific to the design under test and cannot be generalized.

Voltage scaling has been employed as a major technique for power reductions in the aforementioned prior approaches. A serious impediment to these techniques is the overhead of routing three or more voltage planes and the necessity of added level shifters at power-domain crossings resulting in using recovery circuits to recover errors due to voltage scaling. This also leads to an extra area and power overhead from the added recovery circuits.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a method for reconfiguring an ASIC at runtime. A functional criticality of a set of logic in the ASIC is first identified. The set of logic are classified into a set of regions based on the functional criticality, each region of the set of regions having a target error threshold. Further, each region is power gated at runtime based on the functional criticality such that the target error threshold is achieved without using voltage over scaling.

Another embodiment provides a method for identifying a functional criticality of a set of logic in an ASIC. The functional criticality of a set of adders and multipliers is identified in the set of logic by computing, incrementally, each bit from least significant bit to most significant bit. Then the output bits of the set of adders and multipliers are classified into significant bits and non-significant bits. The optimal adder-multiplier combination that meets the target error threshold with least area is then calculated. Further, a set of flip flops are classified into critical flip flops and non-critical flip flops using fan-out and fan-in analysis.

Another embodiment provides a reconfigurable ASIC. The reconfigurable ASIC includes a set of logic, each having a functional criticality associated and a set of regions having the set of logic based on the functional criticality. Each region of the set of regions has a target error threshold. The ASIC further includes a set of power switches, each associated with the set of regions. Each power switch is configured to be controlled at runtime based on the functional criticality such that a predefined target error threshold is achieved without using voltage over scaling.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
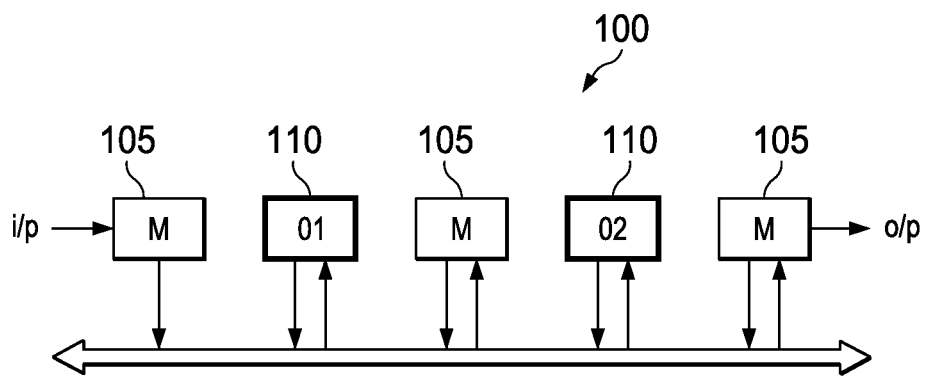
FIG. 1 illustrates an imaging IP (Intellectual Property) in which various embodiments of the present disclosure is implemented.

FIG. 1 illustrates an imaging IP (Intellectual Property) 100 in which various embodiments of the present disclosure is implemented. The imaging IP (Intellectual Property) 100 interfaces with the imaging sensors to capture raw digital pictures and process them either as still captures or video to enhance the quality of the captured raw data. Imaging IPs 100 are used in a wide variety of camera based applications ranging from automotive and transportation, multimedia, consumer electronics, medical and health care, computer vision and robotics, video based security products etc. The design under consideration is one such imaging IP (Intellectual Property) that is used for improving image quality. The imaging IP (Intellectual Property) 100 is used to reduce/remove noise in images without blurring out details, or image features. It is particularly useful for processing images captured in low light settings. The imaging IP (Intellectual Property) 100 also aims at improving the sharpness of the captured image.

The sequence of the blocks shown in FIG. 1 is only for illustration and may vary across designs. The modules (denoted as group M 105) are referred to as mandatory blocks/logics. These are the logics that every input has to pass through and are not user controlled. On the other hand, the remaining modules (denoted as group O 110), are optional modules that are user enabled/disabled based on application. Each of the blocks in the design is involved with a variety of functions such as white balance, color filter array (CFA) interpolation, color correction, 2-D filtering, down-sampling, etc.

An important factor contributing to designing stochastic designs is to choose the correct error metric to evaluate functional criticality of the set of logic within a design. The error metric chosen should not only be quickly computed (to reduce simulation time) but should also account for the error resiliency in the application that the ASIC is targeted for. Several embodiments of the disclosure use peak-signal-to-noise-ratio (PSNR) as the error metric to quantify the quality of the output image. One embodiment provides a stochastic circuit which under the worst-case scenario will generate an image with a minimum PSNR of 30 dB. The tunability aspect of an embodiment allows the user to tune the circuit for error thresholds between infinite PSNR and 30 dB. The 30 dB threshold is being referred to as the maximum error-threshold and the error-threshold at which the user wishes to operate the circuit, as the target error-threshold.

Adders and multipliers are extensively used in DSPs and multimedia hardware to implement complex functions such as matrix multiplications, root mean square (RMS), filters, etc. As the role of each adder/multiplier instance is different, one solution/optimization is not applicable for all instances. At the same time, optimizing each adder/multiplier separately will exponentially increase the design time for larger ASICs. Thus, in one embodiment, a group of adders/multipliers are treated together based on their functionality such that the design time does not escalate and also the error resilience potential of the design is accurately captured. The following description of FIG. 2 explains this in detail.

Figure 2:
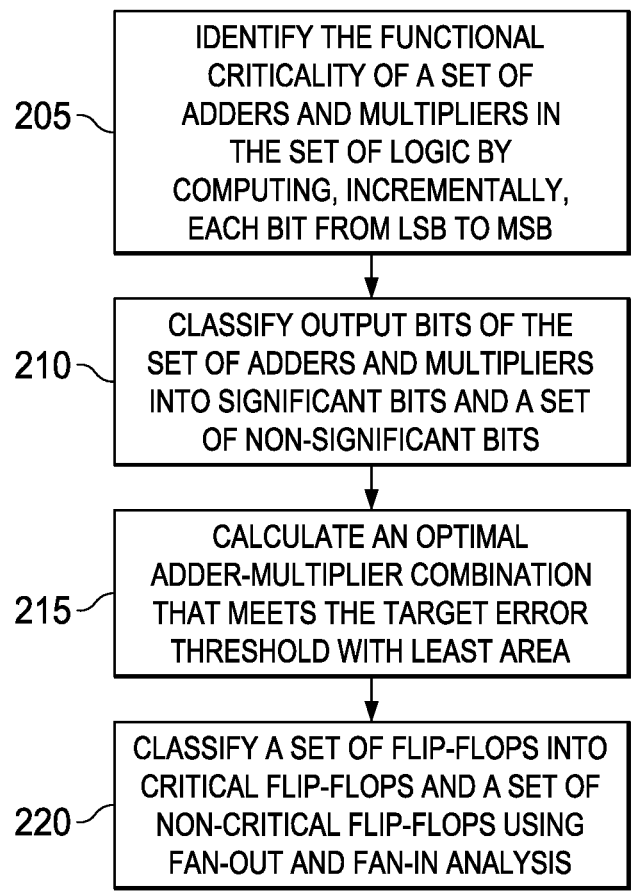
FIG. 2 is a flow diagram illustrating a method for identifying a functional criticality of a set of logic in an ASIC according to an embodiment.

FIG. 2 is a flow diagram illustrating a method for identifying a functional criticality of a set of logic in an ASIC according to an embodiment. The set of logic includes, but not limited to, adders, multipliers and flip flops. Adders and multipliers are picked as the anchor points of analysis (it is noted that the Dot product is dominant computation for imaging applications). At step 205 the functional criticality of a set of adders and multipliers in the set of logic is identified first by computing, incrementally, each bit from least significant bit (LSB) to most significant bit (MSB).

At step 210, the output bits of the set of adders and multipliers are classified into significant bits and non-significant bits. Significance analysis for the output bits of the set of adders and multipliers in a mandatory logic of the set of logic is first performed. Then, significance analysis for the output bits of the set of adders and multipliers in an optional logic of the set of logic is performed. The output bits of each adder/multiplier in the entire design are classified into two bins. In one embodiment, significant bits are output bits whose corruption causes the output quality to degrade beyond the maximum error threshold (30 dB). Non-significant bits are output bits whose corruption generates a tolerable quality output image. In order to achieve such a classification, all blocks/logics are initially classified within a design as either mandatory or optional blocks/logics. The significance analysis is first performed on the output bits of the adders/multipliers in the mandatory blocks/logic and later significance analysis is performed for the adders/multipliers in the optional blocks/logic. It is noted that corruption of a bit may be modeled in multiple ways. In one embodiment, forcing the said bit to "X" may model corruption. In another embodiment, forcing the said bit to a "0" may model corruption when it can be guaranteed that upon powering down the bit would remain at "0" by using additional logic such as isolation cells.

The algorithm for identifying significant and non-significant output bits of the adders/multipliers within the mandatory logic is given in [0024] as algorithm-1. The algorithm 1 adopts a greedy heuristic to output a mandatory-adder-multiplier-ratio (MAMR), which defines the ratio of the non-significant output bits of the adders to those of the multipliers. This ratio in-effect denotes the amount of logic within the adders/multipliers which can be leveraged for energy-quality trade-offs.

---

Algorithm 1: Significance analysis for mandatory logic 1  procedure
2      Disable all optional modules.
3      Identify the adder with largest number of output bits (Amax).
4      n=1
5      while n <= Amax do
6          Simulate RTL with the lower n-bits of all adders corrupted.
7          Record the PSNR of the output image for n.
8          n=n+1
9      end while
10     Let x be the value of n for which PSNR <= max error-threshold.
11     Identify the Multiplier with largest number of output bits (Mmax).
12     p=x
13     while p >= 0 do
14         m=1
15         while m <=Mmax do
16             Simulate RTL with the lower m-bits of all multipliers and lower p-bits of all adders corrupted.
17             Record the PSNR of output image for (p/m) pair.
18             m=m+1
19         end while
20         p=p-1
21     end while
22     Pick the pair (p/m) as the MAMR$_o$ such that the PSNR is <= max error-threshold and maximum power reduction is possible

---

Lines 5-10 in algorithm 1 identify the lower LSB bits (x) of all adders, whose failure will not cause the output image PSNR to cross the max-error threshold. Since the multipliers occupy a larger area and consume higher power than the adders, it is ideal to have maximum bits of the multipliers to be non-significant. The algorithm 1, in the lines 13-22 precisely finds the MAMR$_o$ (=p/m) such that the corruption of the lower p bits of all adders and m bits of all multipliers maintains the error within the maximum error-threshold; and maximum of the multiplier output bits are treated as non-significant. The maximum simulation is of the order of Ap+(Ap*Mm), i.e. all the output bits of all the adders and multipliers are non-significant. It is noted that, though the Algorithm 1 started with the adders and later moved to the multipliers, vice-versa would also lead to the same final value of $MAMR_o$.

With the given $MAMR_o$ from the Algorithm 1, the significant and non-significant output bits of adder/multipliers in the optional block/logic are now calculated. At step 215, optimal adder-multiplier combination that meets the target error threshold with least area is calculated. Algorithm-2 provides the methodology adopted for identifying the optional-adder-multiplier-ratios (OAMRs) i.e., ratio of non-significant output bits of the adders to those of the multipliers within each optional module for a specific configuration. In line 6 of algorithm-2, for a given configuration under test, a previously disabled optional module (Oi) which is closest to the inputs is enabled. The reason for such a greedy heuristic algorithm, lies in the fact that modules manipulating pixels earlier (closer to the inputs), will have their error propagated to the modules that follow, and thus may lead to magnification of error at the output if not controlled.

---

Algorithm 2: Significance analysis for optional logic

--- procedure
   while Not all configurations tried do
      Select previously untried configuration (Cj ).
      $MAMR_j$ =MAMRo
      while OAMR for all optional modules in this configuration not
             found do

| Configuration | $MAMR_m$ | $OAMR_{O1}$ | $OAMR_{O2}$ |

Enable a previously
                           disabled optional module
                       closest from the input Oi.
         Simulate RTL with $MAMR_j$ corrupted adders/multipliers.
         if Output PSNR within max error-threshold then
            Find $OAMR_{Oi}$ for Oi using Algorithm-2
            Record $OAMR_{Oi}$ for configuration under test.
           else
            Find a new $MAMR_j$ or $OAMR_{Ok}$ (k < > i) such that
PSNR is under maximum threshold.
            Find $OMAMR_{Oi}$ for Oi using Algorithm-2
            Record $OAMR_{Oi}$ for configuration under test.
         end if
      end while
   end while
end procedure

---

In line 12 of Algorithm-2, in order to find a new $MAMR_j$ or $OAMR_{Ok}$, an embodiment reduces p rather than m as that would be optimal from a power-reduction point of view. Once an updated value of $MAMR_j$ or $OAMR_{Ok}$ is obtained, we find $OAMR_{Oi}$. MAMRm and the $OAMR_{Oi}$, for each configuration are tabulated as shown in Table-I below for an example design.

TABLE 1

| | | | | |
|---|---|---|---|---|
| I | O1 & O2 disabled | (9/13) | — | — |
| II | Only O1 enabled | (9/13) | (11/23) | — |
| III | O1 & O2 enabled | (7/11) | (7/25) | (8, 32) |

With the given functional significance distribution of the output bits, the functional significance is propagated to the inputs in the case of adders, and to the partial products in case of the multipliers. For example, for an n-bit two operand adder, the propagation is straightforward. All the input bits which directly contribute to a non-significant output bit are considered non-significant. For a multiplier, however, all the partial products that contribute directly to a non-significant output bit are treated as functionally non-significant. This technique can also be applied to other multiplier logic styles (e.g. wallace-tree, booth encoding etc.). Due to the simple and regular structures of adders and multipliers, the significant and non-significant logic are segmented into separate modules in the register-transfer level (RTL) itself. By implementing such a technique, there is scope for optimizing the timing critical paths of the design which allows increase in performance of the design and/or reduction in area and power to be met.

In a unified design (without modularization), say for a 32-bit multiplier, the synthesis tool infers a 64 bit adder to add all the partial products. Whereas after modularization, the multiplier now is a combination of few smaller adders, since the number and size of partial products within each module reduces. This allows the synthesis tool to perform area and power optimization on each module separately. For the case with fine-grained voltage scaling, isolating the logic into separate modules reduces the inter-criticality crossings, thereby reducing the number of level-shifters required in the design. The level shifters will now be required only at the outputs of the sub modules. It is noted that through modularization, only the structure of the design is changed, and not the functionality. The functional distribution of the output bits of the adders and multipliers still remain the same.

The various adder-multiplier ratios for different configurations were derived using the significance methodology (step 215). The results of this analysis have been tabulated in Table-I given earlier. As can be implied from Table I, the configuration-III requires only the least significant 7 bits of the mandatory adders to be non-significant as compared the lower 9 bits being non-significant for configuration-I & II. It can be inferred that the module O2 slightly magnifies the error it sees at its inputs, causing the adder-multiplier ratios in other blocks to reduce.

It may be noted, that so far only the output bits of the adders and multipliers were classified into significant and non-significant bins, while the glue logic and flip flops in the design have not been analyzed. At step 220, the flip flops are classified into two categories namely critical flip flops and non-critical flip flops. The critical flip flops are all flip flops in the ASIC whose failure may lead to error beyond a maximum error threshold. Non-critical flip flops are all flip flops not belonging to the critical bin.

To further explain, from the Table-I above, the worst case configuration is chosen as the functional significance distribution, i.e., configuration-III. This particular configuration is a sub-set of all the configurations. With these $MAMR_j$ and $OAMR_{Oi}$, the error threshold for all other configurations will be maintained. For e.g., if configuration-I is chosen as the distribution, then an error in the 8th and the 9th bits of the mandatory adders, will cause the PSNR to cross beyond the maximum error-threshold, for configuration-III. Here, fan-out analysis at the adder and multipliers outputs is used to classify flip flops. All the flip flops which are the end-points of the fan-outs of the non-significant output bits and not the endpoints of the fan-outs of the significant output bits are classified as non-critical flip flops. All the other flip flops are treated as critical flip flops. With this flip flop criticality assignment, fan-in analysis is used to classify the rest of the logic cells into most-critical and non-critical logic. All the cells which lie in the fan-in cone of the critical flip flops are treated as most-critical and all the other cells are treated as non-critical. It is noted that through such a technique some of the non-significant logic of the adders and multipliers will now be treated as most critical logic as they feed into the most-critical flip flops. This happens because the glue-logic may create a path from a non-significant output bit to a significant logic (inputs for adders and partial products for multipliers). Such a scenario cannot be detected by pure simulation based approaches, as the particular test case simulated may not excite the target path.

After calculating the functional criticality of the set of logic and partitioning them into regions based on functional criticality, each region is power gated based on functional criticality to achieve a pre-defined target error threshold without using voltage over scaling, according to an embodiment. This is further explained in detail below.

Figure 3:
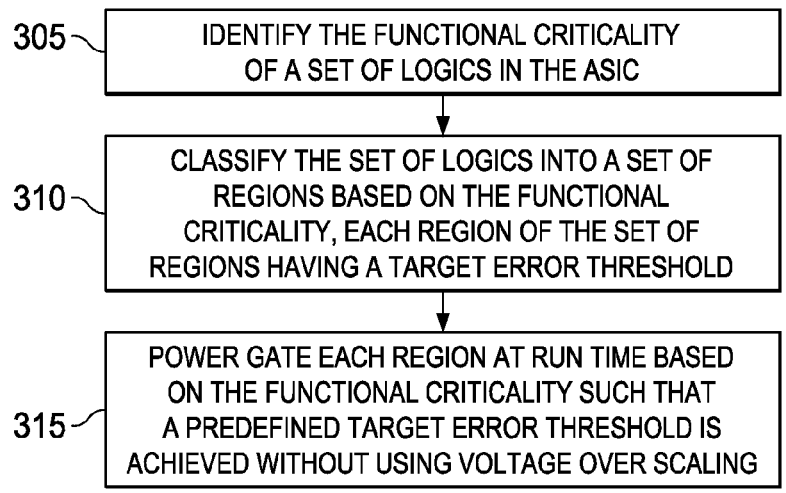
FIG. 3 is a flow diagram illustrating a method for reconfiguring an ASIC according to an embodiment.

Referring now to FIG. 3, at step 305, the functional criticality of a set of logic in the ASIC is identified. As explained earlier in the description of FIG. 2, the functional criticality of a set of adders and multipliers in the set of logic is identified (205) as part of identifying the functional criticality of a set of logic.

At step 310, the set of logic are classified into a set of regions based on the functional criticality, each region of the set of regions having a target error threshold. As explained earlier in the description of FIG. 2, the output bits of the set of adders and multipliers are classified into significant bits and non-significant bits (210). An optimal adder-multiplier combination that meets the target error threshold with least area is then calculated (215). And, the set of flip flops are classified into critical flip flops and a set of non-critical flip flops using fan-out and fan-in analysis (220).

At step 315, each region is power gated at runtime based on the functional criticality such that a predefined target error threshold is achieved without using voltage over scaling. In one embodiment, each region is a power domain. Each power domain has a power switch and this power switch is controllable. The power switch of each power domain is controlled such that the non-critical region is turned off such that a predefined target error threshold is achieved. This is further illustrated in FIG. 4. It is noted that the most critical regions do not have power switch at all. In one embodiment, for designs with multiple configurations, steps 305-315 are performed for each configuration and the <configuration, error> map is stored for each partition. In one embodiment, for soft-IP, if the target design/SoC for the IP has relaxed error threshold, corresponding modules are "pruned" off and constant values forced at the output.

Figure 4:
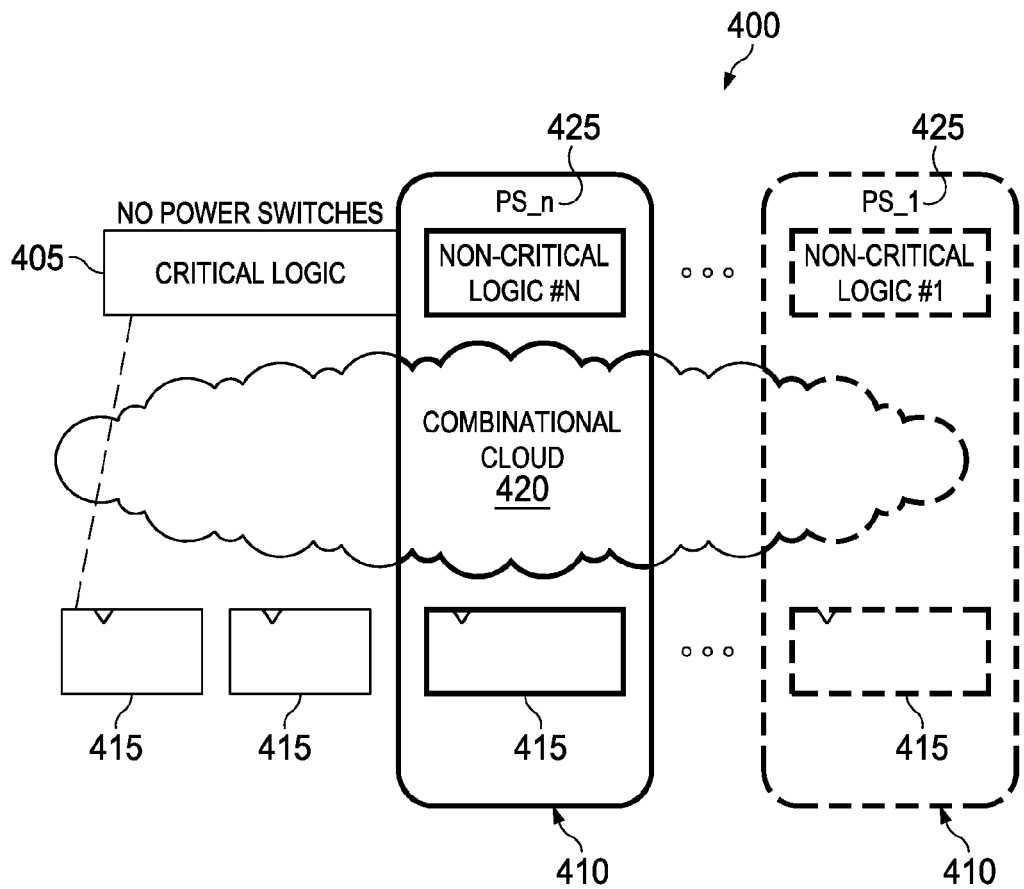
FIG. 4 illustrates a block diagram of a reconfigurable ASIC according to an embodiment.

FIG. 4 illustrates regions of the ASIC with critical logic 405 and multiple non-critical logics 1-n (410), each having power switch PS_1 to PS_n (425) associated with respective non-critical logic. In one embodiment the ASIC is a field programmable gate array. Each region has flip flops 415 and rest of the set of logic gates in a combinational cloud 420. The critical logic 405 region is always active. Within each such region, the power switch controls determine the error tolerance limit seen by a particular application. The non-critical region 1-n (410) are switched off based on a particular application or target error threshold. It is noted that by adopting various embodiments, the ASIC is reconfigured at runtime without using voltage over scaling. Various operating modes and the states of each power switch (425) are illustrated in Table 2 below. In the table, exact refers to exact mode of operation where all the power switches 425 are ON. Operating modes Tune 1-m refers to approximate mode of operation with a pre-defined upper bound error threshold E (i).

TABLE 2

| Operating Modes | PS_1 | PS_2 | ... | PS_n |
|---|---|---|---|---|
| Exact | ON | ON | ... | ON |
| Tune 1 | OFF | ON | ... | ON |
| Tune 2 | ON | OFF | ... | ON |
| Tune m | OFF | OFF | ... | OFF |

It is inferred from the above sections that any error in the critical logic causes the PSNR to exceed the maximum error threshold and thus lead to a poor output image quality in the case of example imaging IP. While above sections describe partitioning into one critical and one non-critical region in one embodiment of the invention, other embodiments may include one critical and multiple non-critical regions; and each region being a power-domain with a power switch to turn on or off as illustrated in FIG. 4 and Table. 2.

It is noted that the steps in FIG. 2 and FIG. 3 can be implemented in a non-transitory computer-readable medium storing a program that causes a computer to execute reconfigurable operation in an ASIC.

Various embodiments provide a fast progressive configuration aware (ProCA) framework which, for a given design and application, will accurately identify functionally-significant logic. The significance analysis accounts for the various configuration modes that the design is capable of operating in, and gives a final functional significance distribution which will satisfy the error constraints under all configuration use modes. Further, various embodiments provide a dynamic architecture re-configuration mechanism, which isolates logic of different functional significance bins at the design stage. This changes the critical paths of the design based on the selected computation and allowing for further increase in performance and/or reduction in overall power dissipated by the design.

Further, various embodiments reduce the simulation time significantly and enables the design to tune itself adaptively for various target error thresholds. The run-time is upperbounded by the sum of the products of the largest adder and multiplier found in the mandatory blocks/logic. For the image restoration IP, ProCA requires up to 43.3 hours of simulation time, which is nearly 10× faster to the analysis proposed in prior art (which requires 437.5 hours of simulation time) and 60× faster than another prior approach (which requires 2800 hours of simulation time). Further, various embodiments partially automates the design process by the use of off-shelf synthesis tools with minimal design level re-structuring and proposes solutions for a single and multi-power domains with negligible area and power overhead.

Processes and logic flows described herein may be performed by one or more programmable processors executing one or more computer programs to perform functions by operating on input data and generating corresponding output. Processes and logic flows described herein may be performed by, and apparatus can also be implemented as, special purpose logic circuitry, e.g., an FPGA device or an ASIC. The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A computer implemented method for reconfiguring an application specific integrated circuit (ASIC) comprising:
   identifying a functional criticality of a set of logic in the ASIC;
   classifying the set of logic into a set of regions based on the functional criticality, each region having a target error threshold; and
   power-gating each region at runtime based on the functional criticality.

2. The method of claim 1, wherein identifying a functional criticality of a set of logic comprises:
   identifying the functional criticality of a set of adders and multipliers in the set of logic;
   classifying output bits of the set of adders and multipliers into significant bits and a set of non-significant bits;
   calculating an optimal adder-multiplier combination that meets the target error threshold with least area; and
   classifying a set of flip flops into critical flip flops and a set of non-critical flip flops using fan-out and fan-in analysis.

3. The method of claim 2, wherein identifying the functional criticality of a set of adders and multipliers in the set of logic comprises:
   computing, incrementally, each bit of a set of bits of the set of adders and multipliers from least significant bit to most significant bit to identify the functional criticality; and
   classifying output bits of the set of adders and multipliers into significant bits and a set of non-significant bits.

4. The method of claim 3, wherein classifying output bits of the set of adders and multipliers into significant bits and a set of non-significant bits comprises:
   performing significance analysis for the output bits of the set of adders and multipliers in a mandatory logic of the set of logic; and
   performing significance analysis for the output bits of the set of adders and multipliers in an optional logic of the set of logic.

5. The method of claim 2, wherein classifying a set of flip flops into critical flip flops and non-critical flip flops using fan-out and fan-in analysis comprises:
   classifying the set of flip flops which are endpoints of the fan-out analysis of non-significant output bits as non-critical flip flops; and
   classifying remaining flip flops of the set of flip flops as critical flip flops.

6. The method of claim 5 further comprising classifying remaining logics of the set of logic into critical and a set of non-critical logic using fan-in analysis wherein the set of logic which lie in a fan-in cone of the critical flip flops are critical logic and the remaining are classified into corresponding non-critical logic.

7. The method of claim 1, wherein classifying the set of logic into a set of regions based on the functional criticality comprises partitioning the set of logic into a set of regions comprising a critical region and a set of non-critical regions.

8. The method of claim 7, wherein the set of regions are power domains, each power domain having a power switch.

9. The method of claim 8, wherein power gating each region based on the functional criticality comprises controlling the power switch of each power domain such that a corresponding non-critical region is turned off.

10. The method of claim 1, wherein the ASIC is a field programmable gate array (FPGA) device.

11. The method of claim 1, wherein power-gating each region at runtime based on the functional criticality is such that the target error threshold is achieved without using voltage over scaling.

12. A computer implemented method for identifying a functional criticality of a set of logic in an application specific integrated circuit (ASIC) comprising:
    identifying the functional criticality of a set of adders and multipliers in the set of logic by computing, incrementally, each bit of a set of bits of the set of adders and multipliers from least significant bit to most significant bit;
    classifying output bits of the set of adders and multipliers into significant bits and a set of non-significant bits;
    calculating optimal adder-multiplier combination that meets a target error threshold with least area; and
    classifying a set of flip flops into critical flip flops and a set of non-critical flip flops using fan-out and fan-in analysis.

13. The method of claim 12, wherein classifying output bits of the set of adders and multipliers into significant bits and non-significant bits comprises:
    performing significance analysis for the output bits of the set of adders and multipliers in a mandatory logic of the set of logic; and
    performing significance analysis for the output bits of the set of adders and multipliers in an optional logic of the set of logic.

14. The method of claim 13, wherein performing significance analysis for the output bits of the set of adders and multipliers comprises:
    using a greedy heuristic algorithm to output a mandatory-adder-multiplier-ratio (MAMR), which defines a ratio of non-significant output bits of the set of adders to those of the set of multipliers.

15. The method of claim 12, wherein classifying a set of flip flops into critical flip flops and a set of non-critical flip flops using fan-out and fan-in analysis comprises:
    classifying all the flip flops which are endpoints of the fan-outs of the non-significant output bits and not endpoints of the fan-out of the significant output bits as non-critical flip flops, for each of the non-significant output bit in the set of non-significant bits; and
    classifying a rest of the set of logic in the ASIC as critical flip flops.

16. A reconfigurable application specific integrated circuit (ASIC) comprising:
    a set of logic, each of the set of logic having a functional criticality associated;
    a set of regions having the set of logic, the set of regions based on the functional criticality, each of the set of regions having a target error threshold; and
    a set of power switches, each of the set of power switches associated with the set of regions, wherein each power switch is configured to be controlled at runtime based on the functional criticality.

17. The reconfigurable ASIC of claim 16, wherein the functional criticality is calculated by identifying the functional criticality of a set of adders and multipliers in the set of logic by computing, incrementally, each bit of a set of bits of the set of adders and multipliers from least significant bit to most significant bit; classifying output bits of the set of adders and multipliers into significant bits and a set of non-significant bits; calculating optimal adder-multiplier combination that meets the target error threshold with least area; and classifying a set of flip flops into critical flip flops and a set of non-critical flip flops using fan-out and fan-in analysis.

18. The reconfigurable ASIC of claim 16, wherein the ASIC is a field programmable gate array (FPGA) device.

19. The reconfigurable ASIC of claim 16, wherein the set of logic comprises a set of adders, multipliers and flip flops.

20. A non-transitory computer-readable medium storing a program that causes a computer to execute reconfigurable operation in an ASIC by:
   identifying a functional criticality of a set of logic in the ASIC;
   classifying the set of logic into a set of regions based on the functional criticality, each region having a target error threshold; and
   power-gating each region at runtime based on the functional criticality.

\* \* \* \* \*